United States Patent
Wu

(10) Patent No.: US 11,508,766 B2
(45) Date of Patent: *Nov. 22, 2022

(54) MOLDED IMAGE SENSOR CHIP SCALE PACKAGES AND RELATED METHODS

(71) Applicant: SEMICONDUCTOR COMPONENTS INDUSTRIES, LLC, Phoenix, AZ (US)

(72) Inventor: Weng-Jin Wu, Hsinchu (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/162,014

(22) Filed: Jan. 29, 2021

(65) Prior Publication Data

US 2021/0151488 A1    May 20, 2021

Related U.S. Application Data

(63) Continuation of application No. 15/957,520, filed on Apr. 19, 2018, now Pat. No. 10,910,421, which is a continuation of application No. 15/405,519, filed on Jan. 13, 2017, now Pat. No. 9,960,197.

(51) Int. Cl.
*H01L 31/0203* (2014.01)
*H01L 27/146* (2006.01)
*H01L 23/31* (2006.01)

(52) U.S. Cl.
CPC .... *H01L 27/14618* (2013.01); *H01L 23/3114* (2013.01); *H01L 27/14636* (2013.01); *H01L 27/14685* (2013.01); *H01L 27/14687* (2013.01); *H01L 27/14698* (2013.01); *H01L 2224/11* (2013.01)

(58) Field of Classification Search
CPC ......... H01L 27/14618; H01L 27/14636; H01L 27/14685; H01L 27/14687; H01L 27/14698; H01L 23/3114; H01L 2224/11
USPC .......................................................... 257/434
See application file for complete search history.

(56) References Cited

U.S. PATENT DOCUMENTS

| | | | |
|---|---|---|---|
| 6,767,753 B2 | 7/2004 | Huang | |
| 9,960,197 B1 * | 5/2018 | Wu | .................... H01L 27/14685 |
| 10,910,421 B2 * | 2/2021 | Wu | .................... H01L 27/14698 |
| 2005/0063033 A1 | 3/2005 | Kinsman | |
| 2005/0236644 A1 | 10/2005 | Getten et al. | |
| 2012/0193744 A1 | 8/2012 | Borthakur et al. | |
| 2012/0235308 A1 | 9/2012 | Takahashi | |
| 2014/0150866 A1 | 6/2014 | Muguruma et al. | |

(Continued)

*Primary Examiner* — Calvin Y Choi
(74) *Attorney, Agent, or Firm* — Adam R. Stephenson, LTD.

(57) ABSTRACT

Implementations of a molded image sensor chip scale package may include an image sensor having a first side and a second side. A first cavity wall and a second cavity wall may be coupled to the first side of the image sensor and extend therefrom. The first cavity wall and the second cavity wall may form a cavity over the image sensor. A transparent layer may be coupled to the first cavity wall and the second cavity wall. A redistribution layer (RDL) may be coupled to the second side of the image sensor. At least one interconnect may be directly coupled to the RDL. A mold material may encapsulate a portion of the RDL, a portion of the image sensor, and a side of each cavity wall, and a portion of the transparent layer.

16 Claims, 5 Drawing Sheets

(56) References Cited

U.S. PATENT DOCUMENTS

| | | |
|---|---|---|
| 2014/0191350 A1 | 7/2014 | Chen et al. |
| 2015/0270237 A1 | 9/2015 | Chi et al. |
| 2016/0190204 A1 | 6/2016 | Chiu |
| 2017/0309771 A1 | 10/2017 | Shen |

* cited by examiner

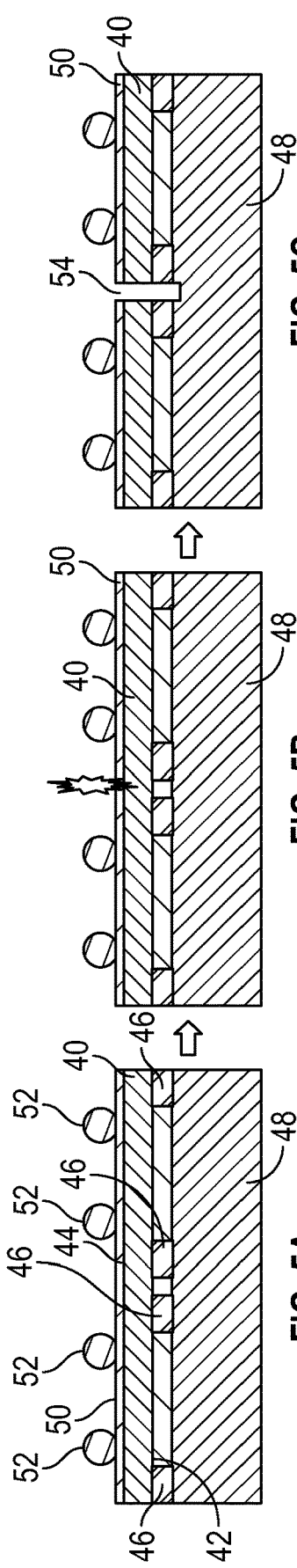
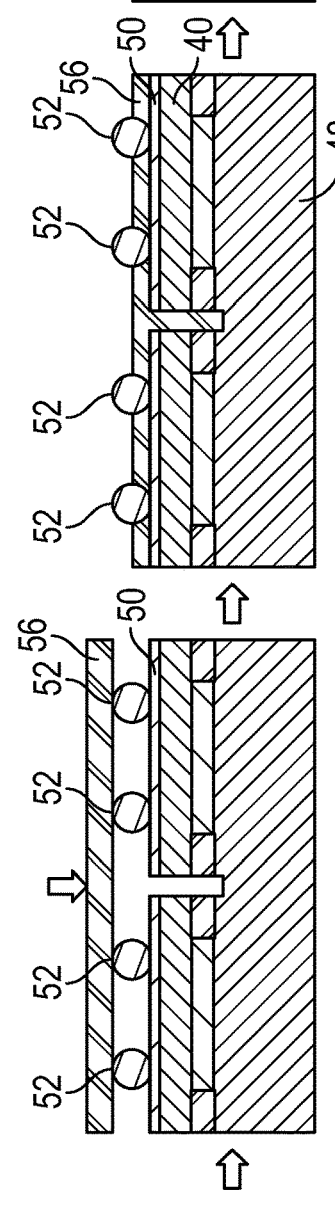
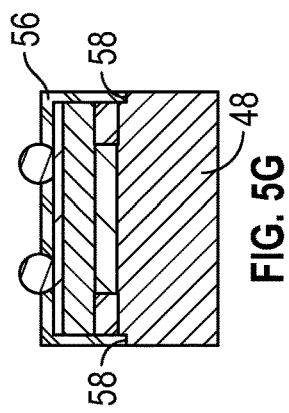
FIG. 5A  FIG. 5B  FIG. 5C
FIG. 5D  FIG. 5E  FIG. 5F
FIG. 5G

MOLDED IMAGE SENSOR CHIP SCALE PACKAGES AND RELATED METHODS

CROSS REFERENCE TO RELATED APPLICATIONS

This application is a continuation application of the earlier U.S. Utility patent application to Weng-Jin Wu entitled "Molded Image Sensor Chip Scale Packages and Related Methods," application Ser. No. 15/957,520, filed Apr. 19, 2018; which is a continuation application of the earlier U.S. Utility patent application to Weng-Jin Wu entitled "Molded Image Sensor Chip Scale Packages and Related Methods," application Ser. No. 15/405,519, filed Jan. 13, 2017, now pending, the disclosures of which are hereby incorporated entirely herein by reference.

BACKGROUND

1. Technical Field

Aspects of this document relate generally to image sensor chip scale packages. More specific implementations involve molded image sensor chip scale packages.

2. Background

Image sensors convey information related to an image by communicating signals in response to incident electromagnetic radiation. Image sensors are used in a variety of devices including smart phones, digital cameras, night vision devices, vehicles, medical imagers, and many others. Image sensors are sometimes packaged in semiconductor packages that involve molding processes.

SUMMARY

Implementations of a molded image sensor chip scale package may include an image sensor having a first side and a second side. A first cavity wall and a second cavity wall may be coupled to the first side of the image sensor and extend therefrom. The first cavity wall and the second cavity wall may form a cavity over the image sensor. A transparent layer may be coupled to the first cavity wall and the second cavity wall. A redistribution layer (RDL) may be coupled to the second side of the image sensor. At least one interconnect may be directly coupled to the RDL. A mold material may encapsulate a portion of the RDL, a portion of the image sensor, a side of each cavity wall, and a portion of the transparent layer.

Implementations of a molded image sensor chip scale package may include one, all, or any of the following:

The mold material may extend along a portion of the RDL, a side of each cavity wall, and a portion of the transparent layer.

The mold material may form a layer parallel with the image sensor and extend along a portion of the RDL, a side of each cavity wall, and a portion of the transparent layer in a direction perpendicular to the image sensor.

The mold material may extend into a groove formed in the transparent layer.

The interconnect may be one of a solder ball, a pillar, a copper ball, a gold ball, and any combination thereof.

The mold material may be a laminatable molding material.

Implementations of a method of forming a molded image sensor chip scale package may include providing a wafer having a first side and a second side. The wafer may have a plurality of image sensors. The method may include coupling the first side of the wafer to a first side of a plurality of cavity walls and coupling a transparent layer to a second side of the plurality of cavity walls. The method may also include coupling a redistribution layer (RDL) to the second side of the wafer. The method may include forming an interconnect on the RDL, a plurality of notches between each image sensor, where the plurality of notches extends from the image sensor into the transparent layer. The method may also include placing a mold material over the interconnect array to encapsulate a portion of the RDL and filling the plurality of notches with the mold material. The method may include singulating each image sensor at each notch of the plurality of notches to form a plurality of chip scale packages.

Implementations of a method of forming a molded image sensor chip scale package may include one, all, or any of the following:

Singulating each image sensor may include forming a layer of mold material that extends into a groove of the transparent layer.

Filling the plurality of notches with the mold material may include extending the mold material along a portion of the RDL, a side of each cavity wall of the plurality of cavity walls, and a portion of the transparent layer.

The mold material may be one of a solid mold material and a liquid mold material.

The mold material may be laminatable.

Placing the mold material over the interconnect array may include laminating the mold material under vacuum conditions.

The notch formed may end in the transparent layer.

The interconnect array may include one of a ball grid array, a land grid array, a pin grid array, a pillar grid array, and any combination thereof.

Implementations of a method of forming a chip scale package may include providing a wafer having a first side and a second side. The wafer may have a plurality of image sensors. The method may include coupling the first side of the wafer to a first side of a plurality of cavity walls and coupling a transparent layer to a second side of the plurality of cavity walls. The method may also include coupling a redistribution layer (RDL) to the second side of the wafer and forming an interconnect on the RDL. The method may include forming a plurality of notches between each image sensor, wherein the plurality of notches extends from the image sensor into the transparent layer. The method may also include placing a mold material over the interconnect array, and laminating the mold material to press the interconnect array through the mold material to encapsulate a portion of the RDL. The method may also include laminating the mold material into each notch of the plurality of notches and singulating each image sensor at each notch of the plurality of notches to form a plurality of chip scale packages.

Implementations of a method of forming a chip scale package may include one, all, or any of the following:

Singulating each image sensor may include forming a layer of mold material that extends into a groove of the transparent layer.

Filling the plurality of notches with the mold material may include extending the mold material along a portion of the RDL, a side of each cavity wall of the plurality of cavity walls, and a portion of the transparent layer.

The mold material may be laminated at a temperature between 30-100 degrees Celsius and a pressure between 0-50 MPa.

The interconnect array may include one of a ball grid array, a land grid array, a pin grid array, a pillar grid array, and any combination thereof.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and:

FIGS. 5A-5G are an illustration of various steps in the formation of a CSP;

DESCRIPTION

This disclosure, its aspects and implementations, are not limited to the specific components, assembly procedures or method elements disclosed herein. Many additional components, assembly procedures and/or method elements known in the art consistent with the intended molded image sensor chip scale package (CSP) will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such molded image sensor CSPs, and implementing components and methods, consistent with the intended operation and methods.

Figure 1:
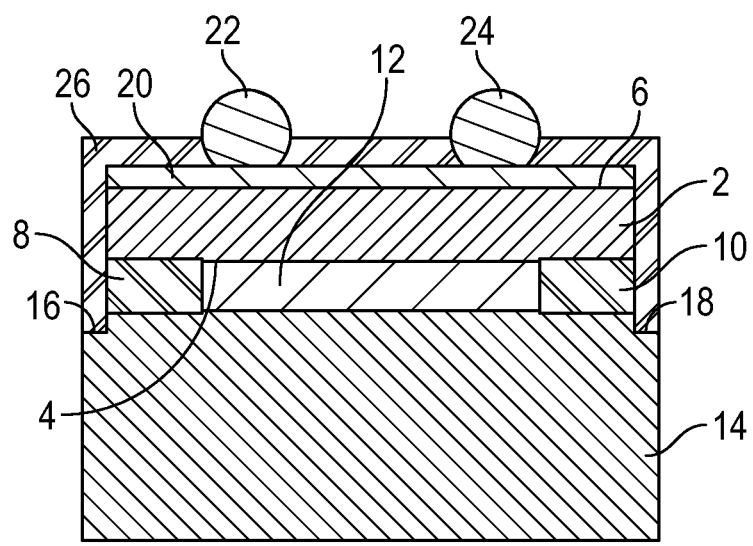
FIGS. 1-4 are cross sectional side views of various implementations of a CSP.

Referring now to FIG. 1, a cross sectional side view of an implementation of a CSP is illustrated. The CSP includes an image sensor 2 having a first side 4 and a second side 6.

In the implementation illustrated in FIG. 1, the first side 4 of the image sensor may be coupled to a first cavity wall 8 and a second cavity wall 10 and form a cavity 12 over the image sensor. In this implementation the outside edges of the cavity walls 8 and 10 are flush with the outside edges of the image sensor, however, in other implementations the outside edges of the image sensor may overhang the cavity walls or the cavity walls may extend past the outside edges of the image sensor. The cavity walls may be made from, by non-limiting example, an encapsulant, a molding polymer, a glass fiber epoxy, a resin, or any combination thereof.

A transparent layer 14 is coupled to the first cavity wall 8 and the second cavity wall 10. The transparent layer 14 may be coupled to the cavity walls using one or more couplers (which may be, by non-limiting example, solder, glue, an adhesive, a tape, etc.). In various implementations the transparent layer may be a glass material or other transparent and/or translucent material. In the implementation illustrated by FIG. 1, there is a first groove 16 and a second groove 18 formed in the transparent layer 14. In one implementation the grooves may be as deep as tens of microns to hundreds of microns, while in other variations the grooves may be shallower or deeper than this range. The grooves may also vary in width. In various implementations, the grooves are as wide as several microns and as narrow as five microns while in still other implementations the grooves are wider than several microns and narrower than five microns. In various implementations, the transparent material may have a single groove or no groove at all.

A redistribution layer (RDL) 20 is coupled to a second side 6 of the image sensor as illustrated by FIG. 1. In various implementations, the CSP may not include an RDL, but the connects to the image sensor may be made directly to the image sensor itself.

At least one interconnect may be directly coupled to the RDL 20. In the example illustrated by FIG. 1, a first interconnect 22 and a second interconnect 24 are coupled to the RDL 20. In various implementations a single interconnect is coupled to the RDL, while in other implementations, more than two interconnects are coupled to the RDL. In implementations where there is no RDL, the interconnect or interconnects may be coupled directly to the image sensor. The at least one interconnect may be, by non-limiting example, a ball, pin, pillar, or other electrically/thermally conductive interconnect device. In implementations where the interconnect is a ball, the ball may be, by non-limiting example, a solder ball, a copper ball, a gold ball, and any combination thereof.

A mold material may encapsulate portions of the CSP to protect from mechanical damage and moisture, especially at the sidewalls of the CSP and the intersections between the interconnect and the RDL. As illustrated, the mold material does not fully encapsulate the interconnects. In the implementation illustrated by FIG. 1, the mold material 26 encapsulates a portion of the RDL 20, a portion of the image sensor 2, a side of each cavity wall, and a portion of the transparent layer 14. In this implementation, the mold material 26 covers any outer point of intersection between the interconnect and the RDL along with any outer point of intersection between RDL 20 and image sensor 2, the image sensor 2 and cavity walls, and the cavity walls and transparent layer 14. In various implementations, the mold material 26 may form a layer parallel with the image sensor 2 and extend along a portion of the RDL 22, two sides of the image sensor 2, a side of each cavity wall, and a portion of the transparent layer 14 in a direction perpendicular to the image sensor. In still other implementations, the mold material 26 may not extend along two sides of the image sensor 2 or along a side of each cavity wall. The mold material 26 may extend partially or fully into grooves 16 and 18. In various implementations, the mold material may be, by non-limiting example, a laminatable (capable of being laminated) molding material, a solid molding material, a liquid molding material, and any combination thereof.

Figure 2:
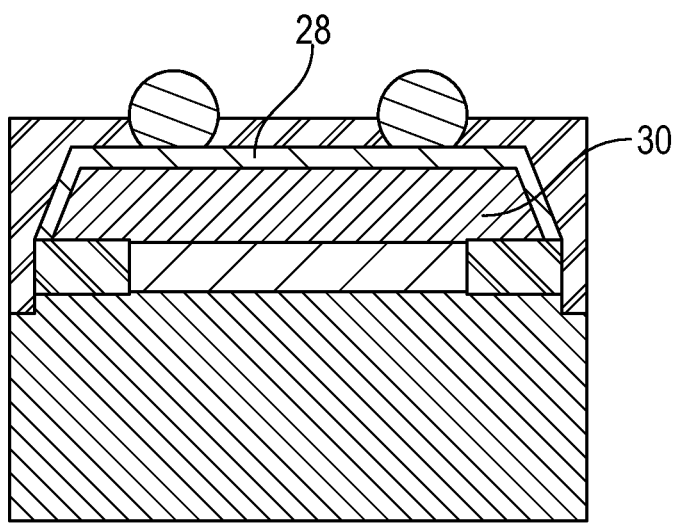

Referring now to FIG. 2, a cross sectional side view of another implementation of a CSP is illustrated. In this implementation, the RDL 28 is coupled to and covers the sidewalls of the image sensor 30. In this implementation, because the RDL 28 covers the side walls of the image sensor 30 the mold material still forms a layer that is coupled (albeit not directly) with the side walls of the image sensor 30.

Figure 3:
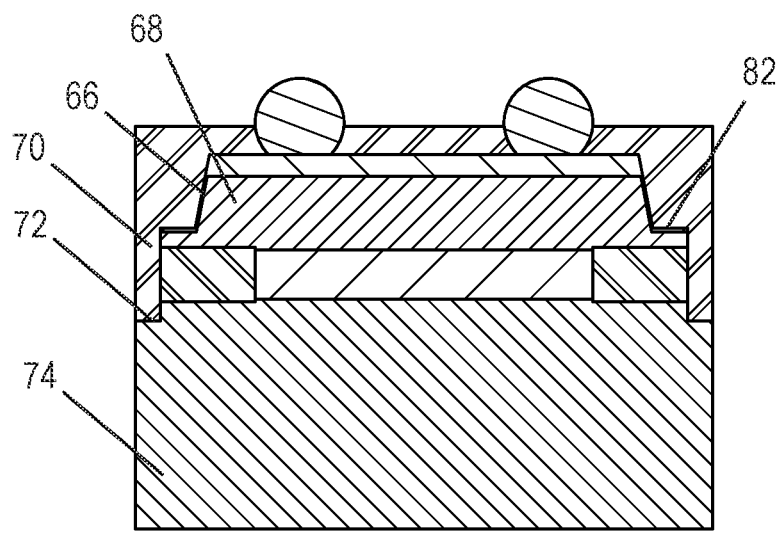
Figure 4:
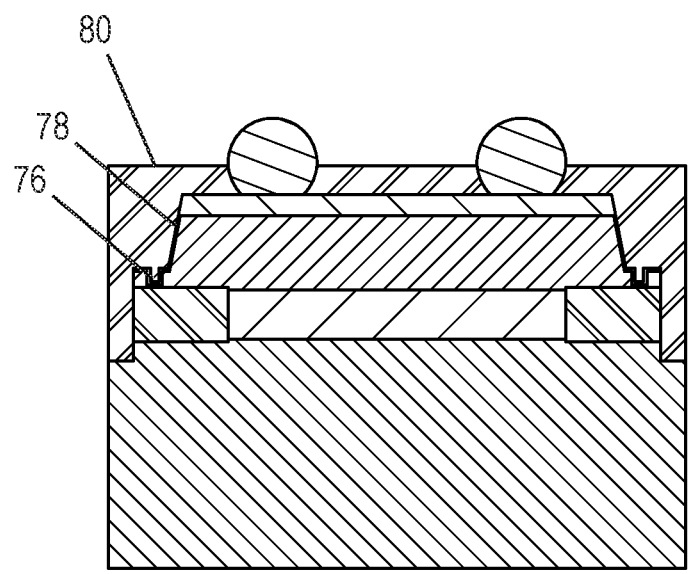

Referring now to FIGS. 3-4, cross sectional side views of various implementations of a CSP are illustrated. In various implementations the image sensors and side walls to the image sensors may vary in shape, size, and position relative to the first and second cavity walls. In FIG. 3, the side walls 66 of the image sensor 68 are stepped, and the mold compound 70 extends along the shape of the stepped image sensor as well as along the RDL layer 82 down into the groove 72 of the transparent layer 74. In FIG. 4, a groove 76 has been formed into a side/perimeter 78 of the image sensor in which the mold material 80 extends. Various implementations like those of FIG. 3 and FIG. 4 may be serve to further aid in engaging the mold material 70, 82 with the image sensor and further preventing ingress of moisture or other contaminants during downstream processing and/or operation of the package.

Reference is now made to FIGS. 5A-5G which illustrate a method of forming a molded image sensor CSP. Referring to block 32 of the process tree of FIG. 6, the method includes providing a CSP wafer structure. A CSP wafer structure is illustrated in FIG. 5A. The method of providing a CSP wafer structure includes providing a wafer 40 that has a first side 42 and a second side 44. The wafer 40 includes a plurality of image sensors. The method includes coupling the first side 42 of the wafer to a first side of a plurality of cavity walls 46. In the implementation shown in FIG. 5A, the cavity walls are not all equally spaced apart, however, in various implementations the cavity walls may be equally spaced. The cavity walls may or may not be the same size relative to each other. The plurality of cavity walls may be made from any of the variety of materials as previously disclosed herein.

The method includes coupling a transparent layer 48 to a second side of the plurality of cavity walls. The transparent layer may be made from glass or any other transparent material. The transparent layer is illustrated in FIG. 5A.

The method includes coupling an RDL 50 to a second side 44 of the wafer. The method also includes forming an interconnect array 52 on the RDL 50. FIG. 5A illustrates the resulting structure following the forming of the interconnect array 52. The interconnect array may include, by non-limiting example, a ball grid array, a land grid array, a pin grid array, a pillar grid array, and any combination thereof. In implementations where a ball grid array is used, the ball grid array may include, by non-limiting example, solder, gold, copper, a different conductive material, or any combination thereof. Electroplating, electroless plating, etching, and any other processing step may be involved in forming the interconnect array in various implementations.

Figure 6:
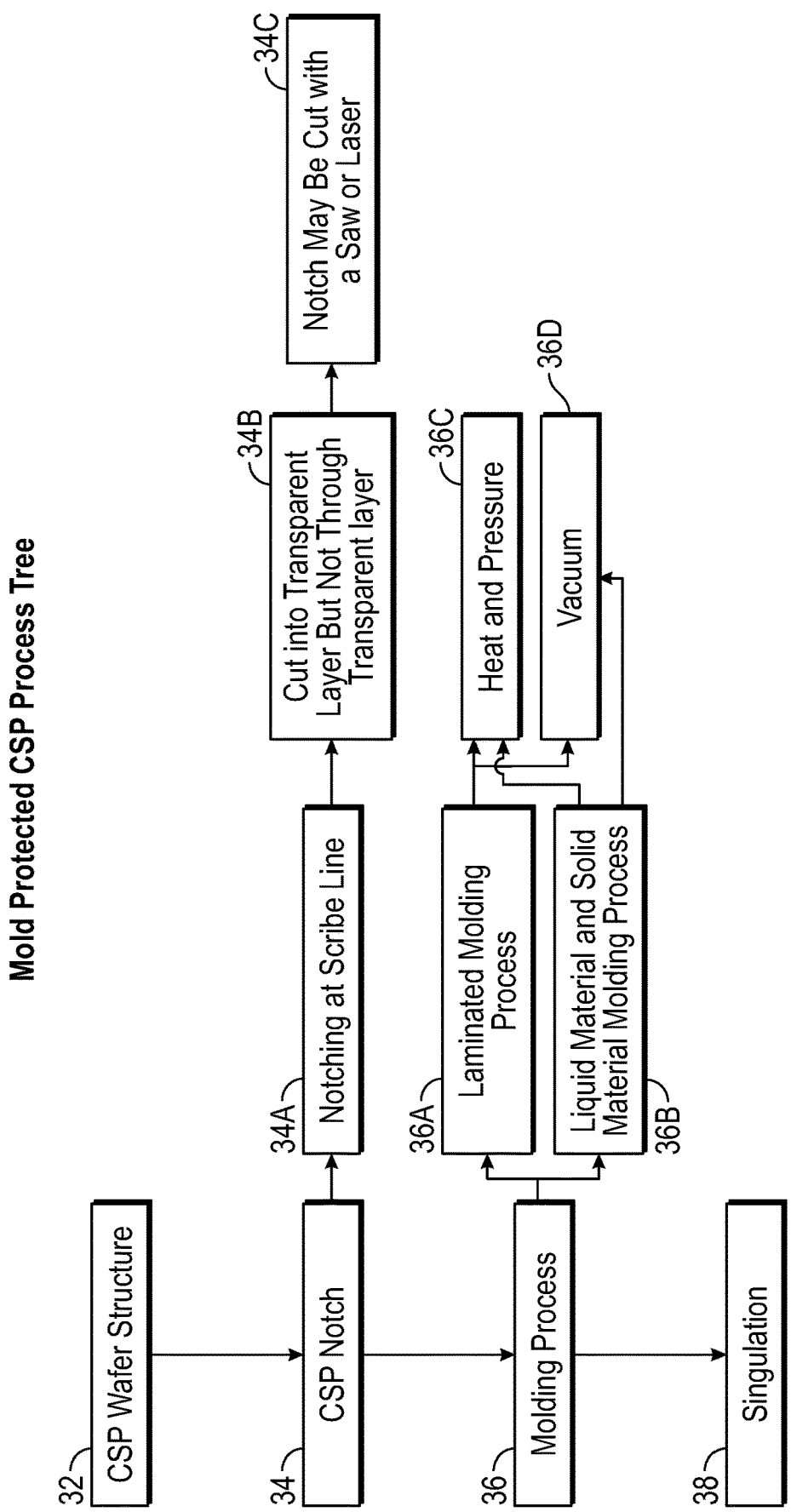
FIG. 6 is a flow chart showing the process of forming the CSP.

The method of forming a CSP includes forming a plurality of notches between each image sensor as represented by block 34 of FIG. 6 and FIGS. 5B-5C. Scribe lines may be formed on the RDL (or on the wafer if there is no RDL) to facilitate forming the plurality of notches as indicated by block 34(a) of FIG. 6. Referring to FIG. 5C, a notch 54 is formed through cutting through the RDL 50, through wafer 40, and into the transparent layer 48. In this implementation, as indicated by block 34(b) of FIG. 6, the notch is cut into the transparent layer 48 but does not go through the transparent layer 48. In the implementation illustrated by FIG. 5B, the notch is not cut through a cavity wall, rather the notch is formed right between two adjacent cavity walls. However, in various implementations the notch may be formed by cutting through the RDL, the wafer, a portion of a single cavity wall, and cutting into the transparent layer. In these implementations the single cavity wall that the notch is formed through becomes two cavity walls upon formation of the notch.

In various implementations, the notch is formed by a saw or a laser as indicated by block 34(c) of FIG. 6. The notch is therefore as wide as the width of the saw blade or laser that formed the notch, and in various implementations may be wider than the width of the saw or laser that formed the notch. In specific implementations the notch is ten or more microns wide. In various implementations, the width of groove 16 and 18 may be larger than 5 um.

The method of forming a CSP includes a molding process as indicated by block 36 of FIG. 6. Referring to FIG. 5D, the method specifically includes placing a mold material 56 over the interconnect array 52 to encapsulate a portion of the RDL 50. The mold material 56 is applied to the CSP wafer structure in a manner that allows for the interconnect array to press through the mold material and encapsulate a portion of the RDL as illustrated by FIG. 5E. The interconnect array is partially exposed as it pierces through the mold material. In various implementations, the placing the mold material includes laminating the mold material to press the interconnect array through the mold material. The mold material 50 may form a layer parallel with the wafer 40. In the implementation illustrated by FIG. 5E, the mold material may 50 cover any outer point of intersection between the interconnect array 52 and the RDL 50.

The method also includes filling the plurality of notches with the mold material 56 as illustrated by FIG. 5E. In the implementation illustrated, the plurality of notches is completely filled with the mold material, however, in various implementations the plurality of notches may be only substantially filled, or partially filled. In various implementations, the mold material 56 extends along a portion of the RDL 50, a side of each cavity wall of the plurality of cavity walls, and a portion of the transparent layer 48. The mold material 56 in particular implementations covers any point of intersection within the plurality of notches between RDL 50 and wafer 40, the wafer 40 and the cavity walls, and the cavity walls and transparent layer 48.

The mold material may be a solid mold material or a liquid mold material as indicated by block 36(b) of FIG. 6. The mold material 56 may also be a laminatable mold material as indicated by block 36(a) of FIG. 6. The mold material may be applied under vacuum conditions as indicated by block 36(d) of FIG. 6 in various implementations. In other implementations, the mold material may be applied using heat, pressure, or a combination of heat and pressure as indicated by block 36(c) of FIG. 6. In implementations where the mold material is laminated, the method of forming a CSP may include laminating the mold material at a temperature from about 30 to about 100 degrees Celsius and at a pressure from about 0 MPa to about 50 MPa.

The method of forming a CSP includes singulating each image sensor in the wafer 40 at each notch 54 of the plurality of notches, as indicated by FIG. 5F and block 38 of FIG. 6. In various implementations, singulating the image sensors occurs after forming a layer of mold material that extends into a groove 58 of a transparent layer 48 as illustrated by FIG. 5G. During singulating, a portion of the mold material in the plurality of notches will be cut away by the singulation process.

Figure 7:
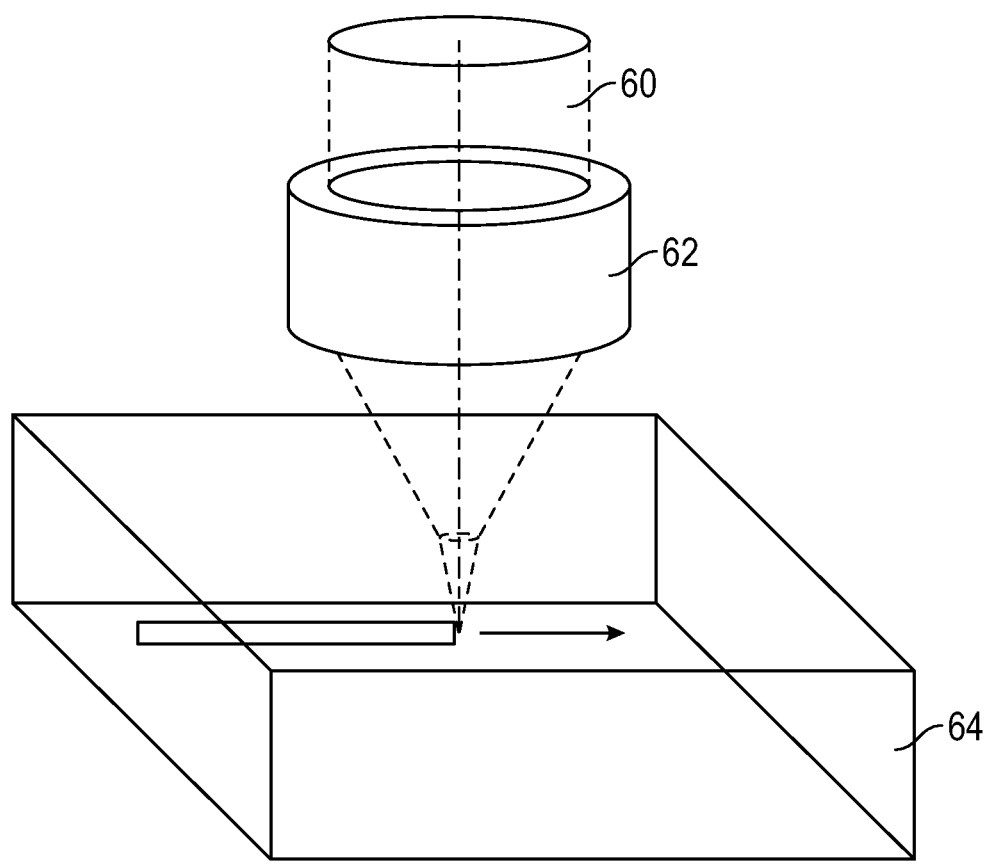
FIG. 7 is an illustration depicting stealth dicing technology.

The method may include singulating the image sensors using a saw or a laser. The width of the saw or laser as applied to the CSP wafer structure and used to singulate the image sensors is less than the width of the plurality of notches as described herein. In various implementations stealth dicing technology may be used to singulate the image sensors. Referring now to FIG. 7, a depiction of stealth dicing technology is illustrated. A laser 60 is projected through a focusing lens 62 and applied to a wafer 64 to focus the light at a predetermined depth into the wafer. The resulting heat creates forces that act to singulate individual chips or image sensors. Stealth dicing could be used to focus the light into the wafer underneath the notches to prevent the notch material from becoming charred or otherwise damaged during the singulation process through receiving too much focused laser light. Since the wafer receives the focused light, the dicing effect will be focused on the wafer, allowing each CSP to separate first at the wafer level and then separate the mold material in the various notches.

In places where the description above refers to particular implementations of a molded image sensor CSP and implementing components, sub-components, methods and sub-methods, it should be readily apparent that a number of modifications may be made without departing from the spirit thereof and that these implementations, implementing components, sub-components, methods and sub-methods may be applied to other CSPs.

What is claimed is:

1. A method of forming a chip scale package, the method comprising:
   providing a wafer comprising a first side and a second side, the wafer comprising a plurality of image sensors;
   coupling the first side of the wafer to an optically transmissive layer forming a plurality of cavities between the first side of the wafer and the optically transmissive layer;
   coupling a redistribution layer (RDL) to the second side of the wafer;
   forming a plurality of notches between each image sensor of the plurality of image sensors, the plurality of notches each extending through a thickness of the wafer into the optically transmissive layer;
   filling the plurality of notches with a liquid mold material; and
   singulating each image sensor of the plurality of image sensors at each notch of the plurality of notches to form a plurality of chip scale packages.

2. The method of claim 1, further comprising encapsulating a portion of the RDL with the liquid mold material.

3. The method of claim 1, wherein forming a plurality of cavities between the first side of the wafer and the optically transmissive layer comprises using a plurality of cavity walls.

4. The method of claim 1, wherein filling the plurality of notches with a liquid mold material further comprises using vacuum.

5. A method of forming a chip scale package, the method comprising:
   providing a wafer comprising a first side and a second side, the wafer comprising a plurality of image sensors;
   coupling the first side of the wafer to an optically transmissive layer forming a plurality of cavities between the first side of the wafer and the optically transmissive layer;
   coupling a redistribution layer (RDL) to the second side of the wafer;
   forming a plurality of notches between each image sensor of the plurality of image sensors, the plurality of notches each extending through a thickness of the wafer into the optically transmissive layer;
   filling the plurality of notches with a solid mold material; and
   singulating each image sensor of the plurality of image sensors at each notch of the plurality of notches to form a plurality of chip scale packages.

6. The method of claim 5, further comprising encapsulating a portion of the RDL with the solid mold material.

7. The method of claim 5, wherein forming a plurality of cavities between the first side of the wafer and the optically transmissive layer comprises using a plurality of cavity walls.

8. The method of claim 5, wherein filling the plurality of notches with a solid mold material further comprises using vacuum.

9. The method of claim 5, wherein filling the plurality of notches with a solid mold compound further comprises using heat and pressure.

10. A chip scale package comprising:
    an image sensor comprising a first side and a second side;
    a first cavity wall and a second cavity wall coupled to the first side of the image sensor and to an optically transmissive layer, wherein the first cavity wall and the second cavity wall and the optically transmissive layer form a cavity over the image sensor;
    a redistribution layer (RDL) coupled to the second side of the image sensor; and
    a mold material, wherein the mold material extends along a portion of the RDL, an angled portion of the image sensor, a side of each cavity wall, and a portion of the optically transmissive layer.

11. The package of claim 10, wherein the mold material forms a layer parallel with the image sensor and extends along a portion of the RDL, a side of each cavity wall, and a portion of the transparent layer in a direction perpendicular to the image sensor.

12. The package of claim 10, wherein the mold material is one of a solid mold material or a liquid mold material.

13. The package of claim 10, further comprising at least one interconnect coupled with the RDL wherein the interconnect is one of a solder ball, a pillar, a copper ball, a gold ball, and any combination thereof.

14. The package of claim 10, wherein the mold material is a laminatable molding material.

15. The package of claim 10, wherein the angled portion of the image sensor extends fully across a thickness of the image sensor.

16. The package of claim 10, wherein the angled portion of the image sensor extends partially across a thickness of the image sensor.

* * * * *